(12) United States Patent
Miyahara et al.

(10) Patent No.: US 6,439,299 B1
(45) Date of Patent: Aug. 27, 2002

(54) HEATSINK APPARATUS

(75) Inventors: Masaharu Miyahara, Nakatsu; Koji Mehara; Hidefumi Koya, both of Usa, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 10 days.

(21) Appl. No.: 09/711,941

(22) Filed: Nov. 15, 2000

(30) Foreign Application Priority Data

Nov. 16, 1999 (JP) .......................................... 11-325104
Jul. 27, 2000 (JP) ........................................ 2000-226585

(51) Int. Cl.[7] .................................................. F28F 3/06
(52) U.S. Cl. ..................... 165/121; 165/80.3; 361/697; 174/16.3; 257/722; 257/707
(58) Field of Search ................................ 165/185, 80.3; 361/697, 700, 703, 709, 710; 257/706, 707, 722; 174/16.3

(56) References Cited

U.S. PATENT DOCUMENTS

| | | | | |
|---|---|---|---|---|
| 5,256,902 A | * | 10/1993 | Culver | 257/722 |
| 5,381,859 A | * | 1/1995 | Minakami et al. | 165/80.3 |
| 5,504,650 A | * | 4/1996 | Katsui et al. | 361/697 |
| 5,567,986 A | * | 10/1996 | Ishida | 257/206 |
| 5,815,921 A | * | 10/1998 | Burward-Hoy | 361/697 |
| 5,960,871 A | * | 10/1999 | Chen | 165/185 |
| 6,166,906 A | * | 12/2000 | Sun et al. | 361/697 |
| 6,227,286 B1 | * | 5/2001 | Katsui | 165/80.3 |

FOREIGN PATENT DOCUMENTS

| | | |
|---|---|---|
| JP | 2804690 | 4/1994 |
| JP | 7111302 | 4/1995 |
| JP | 11097873 | 4/1999 |

* cited by examiner

*Primary Examiner*—Henry Bennett
*Assistant Examiner*—Terrell McKinnon
(74) *Attorney, Agent, or Firm*—Stevens, Davis, Miller & Mosher, LLP

(57) ABSTRACT

A heatsink apparatus has a construction which produces a high heat-radiating effect even if the apparatus is designed to be compact or to have a small thickness. The heatsink apparatus includes a base plate to which a heat-generating body may be connected, a heat-radiating portion, and a fan mounted on the base plate. The heat-radiating portion includes plate-like members having main surfaces facing the base plated, and a fan mounted on the base plate.

21 Claims, 17 Drawing Sheets

FIG. 13B
FIG. 13A
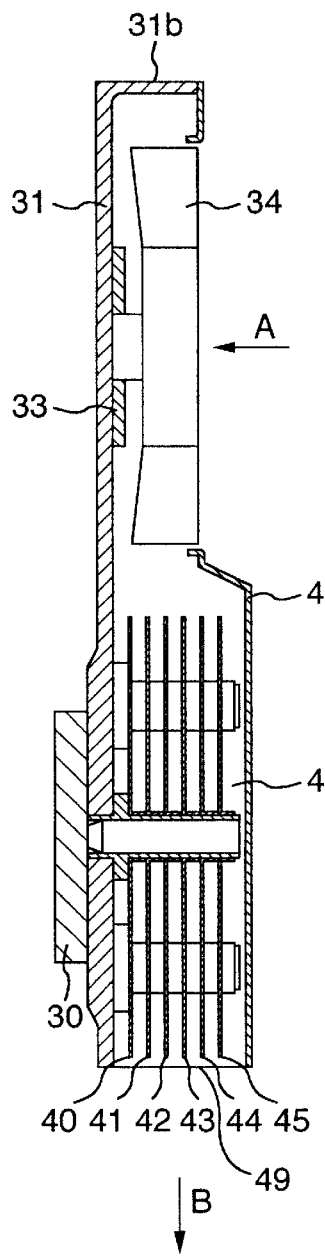
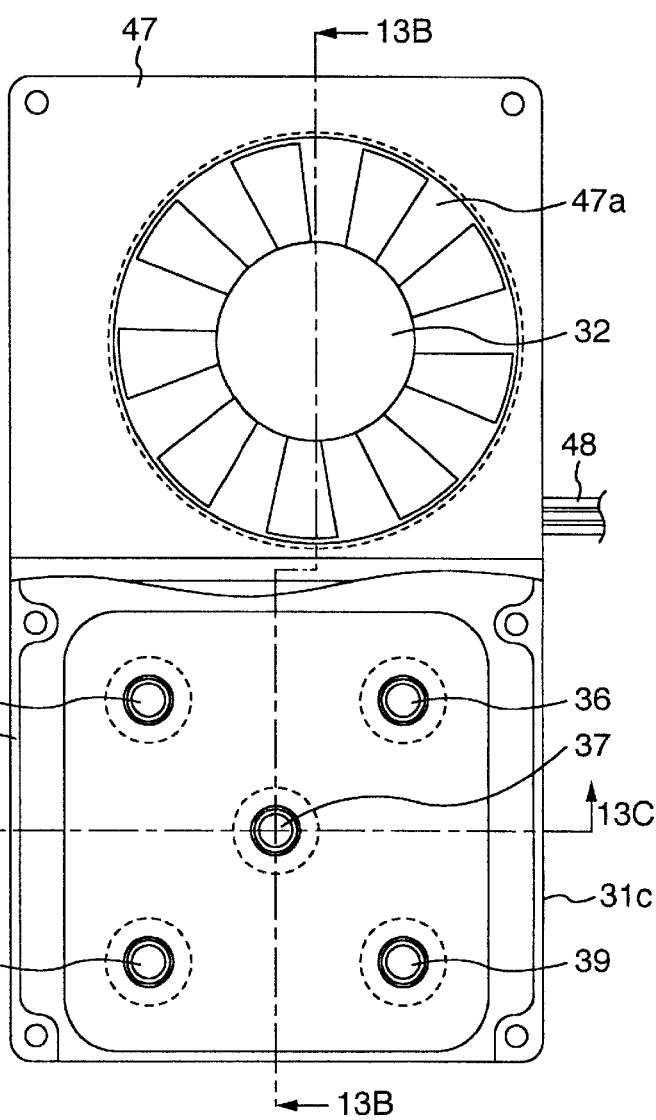
FIG. 13C
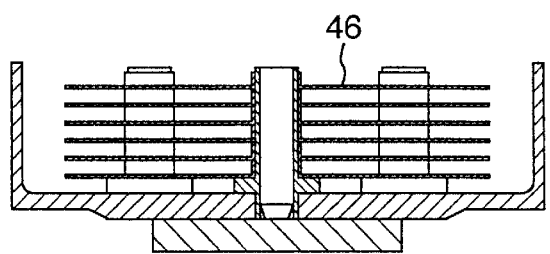

HEATSINK APPARATUS

BACKGROUND OF THE INVENTION

1. Field of the Invention

The present invention relates to a heatsink apparatus for cooling a semiconductor device, such as an IC, an LSI and an MPU, and electronic parts.

2. Description of the Related Art

With a high-performance design of a semiconductor device such as an MPU, generation of heat by the semiconductor device has caused a problem. The heat generated by the semiconductor device has caused an improper operation of the semiconductor device itself and thermal damage to other parts provided in the vicinity of the semiconductor device.

In an attempt to suppress heating of the semiconductor device, the semiconductor itself has been improved, but still holds very high heat energy.

In order to solve such problem, there have been developed and marketed a heatsink apparatus includeing a heatsink formed of a thermally-conductive material so as to promote radiation of heat from a semiconductor device, and a heatsink apparatus including blowing means (such as a fan) provided integrally with the heatsink so as to further promote heat radiation.

There has hitherto been known a heatsink including fins formed integrally on a base plate. Another known heatsink includes a plurality of plates stacked together. Further, a heatsink apparatus including a fan mounted on an upper surface of such known heatsinks has been known.

SUMMARY OF THE INVENTION

It is an object of this invention to provide a heatsink apparatus which may produce a high heat-radiating effect, even if the apparatus is designed to be compact or to have a small thickness with a view to making the apparatus compatible with a computer of a smaller size and a mobile terminal.

According to the invention, there is provided a heatsink apparatus including a base plate, to which a heat-generating body can be connected, a heat radiating portion, and blowing means mounted directly or indirectly on the base plate. The radiating portion includes plate-like members having main surfaces facing the base plate.

BRIEF DESCRIPTION OF THE DRAWINGS

FIG. 13A is a plan view showing a third embodiment of a heatsink apparatus according to the invention;

FIG. 13B is a cross-sectional view taken along the line 13B—13B in FIG. 13A;

FIG. 13C is a cross-sectional view taken along the line 13C—13C in FIG. 13A;

DESCRIPTION OF THE PREFERRED EMBODIMENTS

First Embodiment

Figure 1:
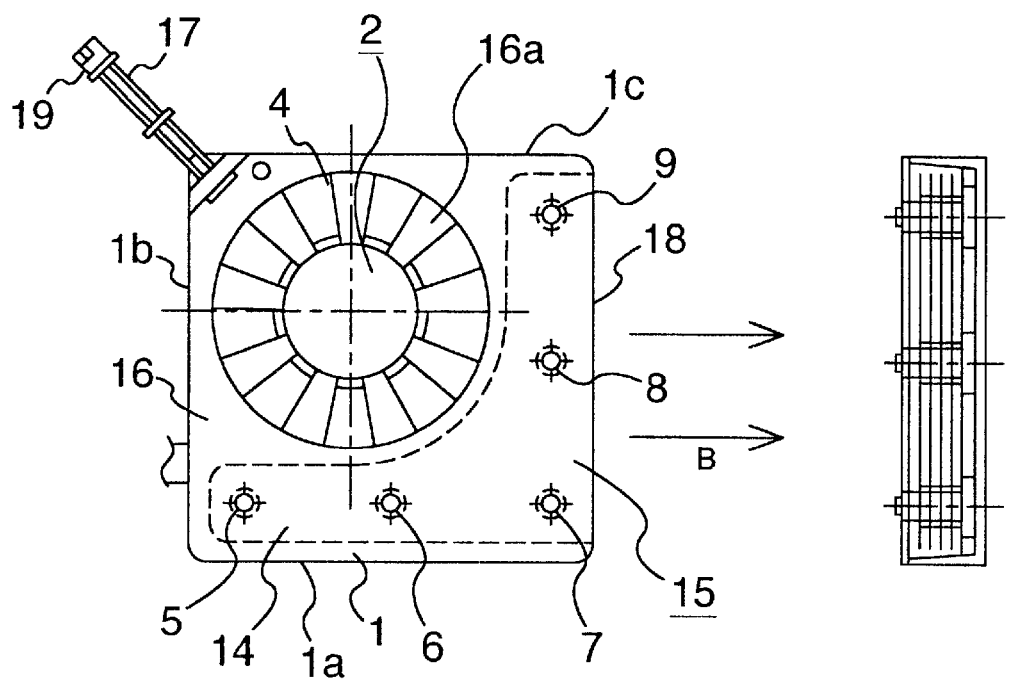
FIG. 1 is a plan view of a first embodiment of a heatsink apparatus according to the invention.
Figure 2:
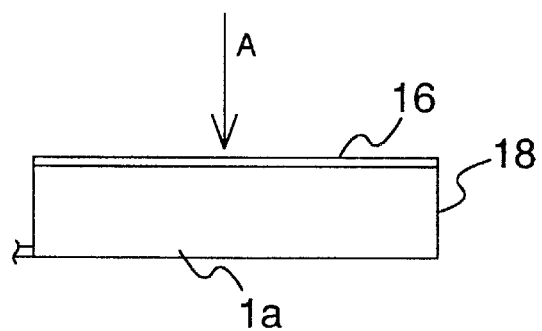
FIG. 2 is a side-elevational view of the heatsink apparatus shown in FIG. 1.
Figure 3:
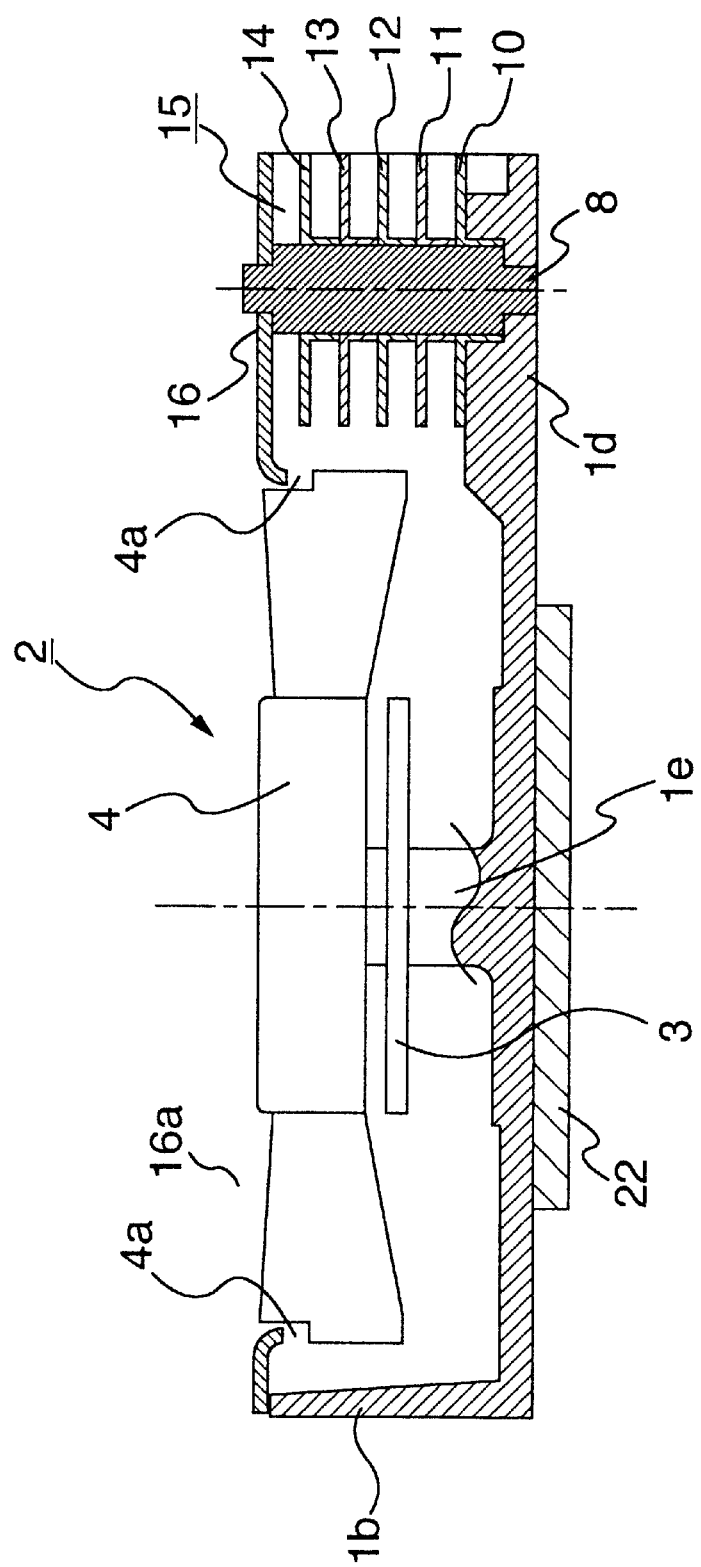
FIG. 3 is a cross-sectional view of the heatsink apparatus.

FIGS. 1, 2 and 3 are a plan view, a side-elevational view and a cross-sectional view, respectively, of a first embodiment of a heatsink apparatus according to the invention.

In FIGS. 1 to 3, a fan 2 is mounted on a base plate 1. Generally, the fan 2 comprises drive means such as a motor, and an impeller driven by the drive means. In this embodiment, the fan 2 comprises a motor portion 3, including coils and magnets (not shown), and an impeller 4 mounted on the motor portion 3. Pillar-like members 5 to 9 are mounted perpendicularly on the base plate 1, and plate-like (or sheet-like) members 10 to 14 of generally L-shape are mounted on the pillar-like members 5 to 9 by press-fitting or other means. The plate-like members 10 to 14, mounted on the pillar-like members 5 to 9, are spaced a predetermined distance from one another. The plate-like members 10 to 14 form a radiating portion 15.

A cover 16 is mounted directly or indirectly on the base plate 1 to cover the radiating portion 15, and an opening or a hole 16a is formed in that portion of the cover 16 facing the fan 2.

Lead wires 17 supply at least an electric power for rotating the fan 2, and a connector 19 is secured to the lead wires 17.

The base plate 1 has three side walls 1a, 1b and 1c formed integrally at three side edge portions thereof, respectively. The cover 16 is held against edges of the side walls 1a, 1b and 1c. An opening is formed at that side of the base plate 1 (having no side wall) opposed to the side wall 1b, and this opening serves as a gas discharge port 18. In accordance with the rotation of the fan 2, gas flows into the heatsink apparatus in a vertical direction A, and then the gas absorbs heat from the plate-like members 10 to 14 when it passes these plate-like members 10 to 14, and the thus heated gas is discharged from the heatsink apparatus through the gas discharge port 18 in a direction B.

In the heatsink apparatus having such construction, the main surfaces of the plate-like members 10 to 14 of the radiating portion 15 face the base plate 1 (preferably in parallel relation thereto), and with this construction, heat can be efficiently transmitted from the plate-like members 10 and 14 to a stream of gas produced by the fan 2, and therefore a heat-radiating effect can be enhanced though the heatsink apparatus is compact in size. Besides, the plate-like members 10 to 14 are held by the pillar-like members 5 to 9, and with this construction heat can be efficiently transferred from the reverse surface of the base plate 1 to the plate-like members 10 to 14, and therefore the heat-radiating effect can be further enhanced.

In this embodiment, the axis of rotation of the fan 2 is offset from the center of the base plate 1, and more specifically the axis of rotation of the fan 2 is offset in a direction away from the gas discharge port 18. With such construction the area of the plate-like members 10 to 14 can be increased, and hence the heat-radiation effect can be further enhanced.

In this embodiment, although the side walls 1a, 1b and 1c are formed integrally at the three side edge portions of the base plate 1, respectively, the side walls may be formed by bending a marginal portion of the cover 16.

Various portions of the heatsink apparatus of the above construction will be described in detail.

First, the base plate 1 will be described.

Preferably, the base plate 1 has a circular shape or a polygonal shape. In the case where the base plate 1 has a circular shape, the characteristics of the heatsink apparatus will not be much influenced by the direction of mounting of the heatsink apparatus on a heat-generating body 22, so that the heatsink apparatus has the stable characteristics. In the case where the base plate 1 has a polygonal shape, the heatsink apparatus can be easily mounted on a semiconductor device or other device, utilizing a corner portion of the polygonal base plate 1 as a reference. Generally, semiconductor devices, such as an MPU, have a square shape, and therefore when the base plate 1 has a square shape, the area of contact of the base plate 1 with the semiconductor device increases, and besides the heatsink apparatus can be mounted in a narrow space, and therefore the heat-radiating effect can be enhanced.

Preferably, the base plate 1 is made of a material having a thermal conductivity coefficient of not less than 90 W/(m·K) at 100° C. More preferably, the base plate 1 has a thermal conductivity coefficient of not less than 100 W/(m·K) at 100° C. The base plate 1 can be made of one material selected from the group (hereinafter referred to as "material group") consisting of zinc, aluminum, brass, gold, silver, tungsten, copper, beryllium, magnesium and molybdenum, or an alloy of at least two materials selected from the material group, or an alloy of at least one material selected from the material group and at least one material other than the material group. In this embodiment, in view of the workability and the cost, the base plate 1 is made of aluminum alone, or an alloy of aluminum and at least one material selected from the material group, or an alloy of aluminum and at least one material selected from materials other than the material group.

In this embodiment, although the base plate 1 is made of one kind of metal material, the base plate may be formed of a plurality of thermally-conductive materials laminated together. For example, a sheet, a foil or a thin film of a material (e.g. copper) having a good thermal conductivity, may be formed on at least a lower surface of the base plate 1 shown in FIG. 3.

Although the side walls 1a, 1b and 1c are formed integrally with the base plate 1, separate side wall members may be fixedly secured to the base plate by press-fitting, an adhesive or screws. In this case, the base plate 1 is generally in the form of a flat plate, and therefore the productivity of the base plate 1 is enhanced, and common parts can be used. The heatsink apparatus, shown in FIGS. 1 to 3, is of the type in which the gas is blown out of the apparatus in one direction, and therefore the three side walls 1a, 1b and 1c are provided. When it is desired to provide the type of heatsink apparatus in which the gas is blown out of the apparatus in two directions, this can be achieved by omitting any one of the side walls 1a, 1b and 1c, and when it is desired to provide the type of heatsink apparatus in which the gas is blown out of the apparatus in three directions, this can be achieved by omitting two of the side walls 1a, 1b and 1c. In the case of providing the type of heatsink apparatus in which the gas is blown out of the apparatus in four directions, no side wall is provided. In such case, the cover 16 is supported by the pillar-like members 5 to 9.

Figure 4:
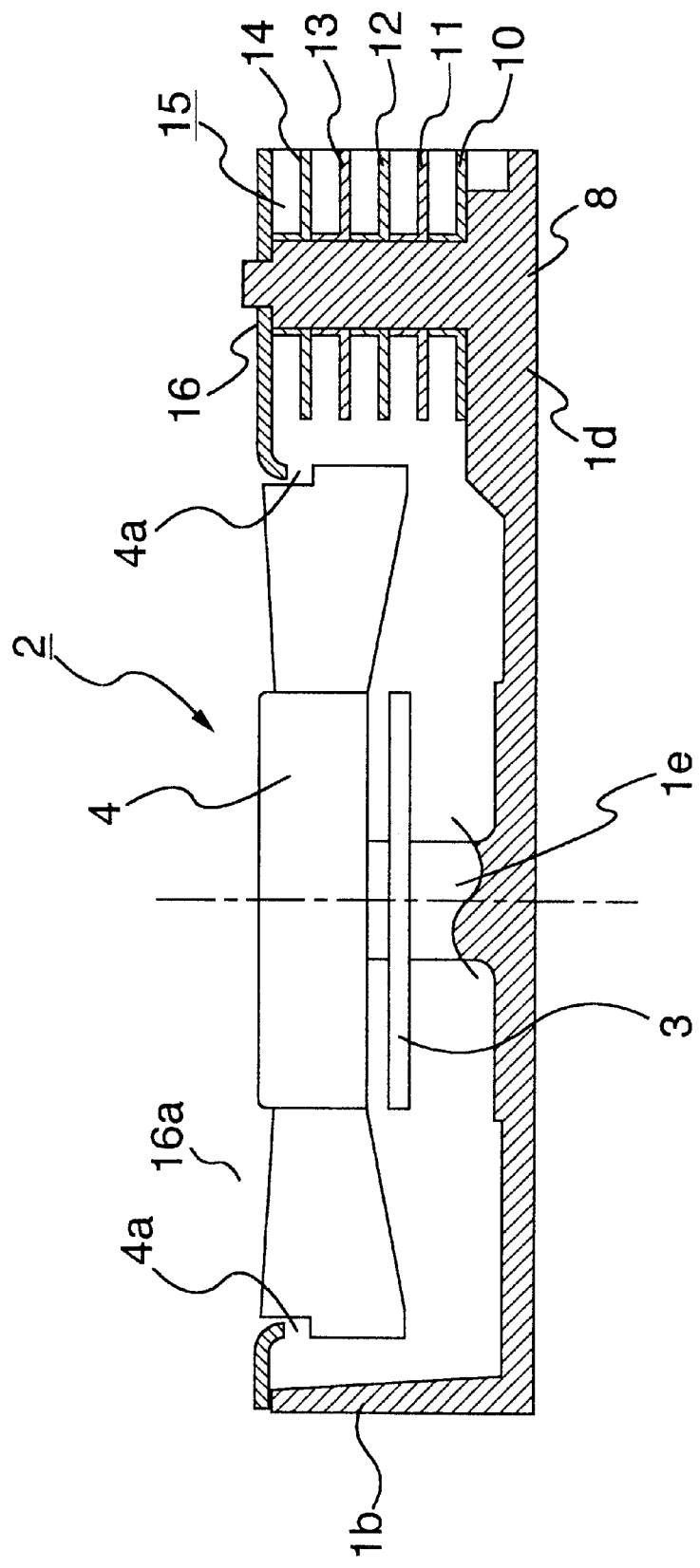
FIG. 4 is a cross-sectional view similar to FIG. 3, showing a modification of the first embodiment.

The pillar-like members 5 to 9 may be formed integrally with the base plate 1, as shown in FIG. 4. Further, the pillar-like members 5 to 9, separate from the base plate 1, may be fixedly mounted on the base plate 1 by press-fitting as shown in FIG. 3 or by screws. In these cases, those portions 1d of the base plate 1, at which the upstanding pillar-like members 5 to 9 are provided, respectively, are larger in thickness than the other portion of the base plate 1 at least except that portion of the base plate at which the motor portion 3 is provided. With such construction, the heatsink apparatus of an increased mechanical strength can be provided.

In the case where the pillar-like members 5 to 9, separate from the base plate 1, are mounted on the base plate 1 by press-fitting, it is preferred that through holes or recesses for respectively receiving the lower ends of the pillar-like members 5 to 9 be formed in the base plate 1. In the case where the pillar-like members are fixedly secured to the base plate 1 by caulking or screw-fastening, it is preferred that through holes are formed in the base plate 1. In the case where the pillar-like members 5 to 9 are adhesively bonded to the base plate 1, recesses or through holes may not be formed in the base plate 1, but it is preferred to provide recesses and through holes in order to increase the bonding strength.

Next, the fan 2 will be described.

As shown in FIG. 3, a projected portion 1e is formed on the bottom of the base plate 1, and the motor portion 3 is mounted on this projected portion 1e by fitting, press-fitting or adhesive bonding. The impeller 4 is mounted on the motor portion 3, and the motor portion 3 is rotated to rotate the impeller 4. For example, an electric motor, using coils and magnets, or an ultrasonic motor can be used as the motor portion 3. The impeller 4 is suitably made of a resin or the like so that it may have a lightweight design. Heat is transmitted from the base plate 1 to the impeller 4 via the motor portion 3, and therefore when the impeller 4 is made of a thermally-conductive material such as metal, the heat-radiating effect can be further enhanced.

The fan 2 draws an ambient gas (e.g. an air) into the heatsink apparatus, and blows it to the radiating portion 15. Alternatively, the fan 2 draws the gas into the heatsink apparatus through the gas discharge port 18 in a direction opposite to the direction of flow of the gas shown in FIGS. 1 and 2, and discharges it from the heatsink apparatus through the opening 16a. Here, the term "gas" means the air and other gas or gases existing around the fan 2. For example, when nitrogen or inert gas is present in an environment in which the fan 2 exists, the gas means the nitrogen or the inert gas.

A fluid bearing can be used as a bearing of the motor portion 3, and by doing so, vibrations produced during rotation of the motor portion 3 can be suppressed, and therefore noises due to the vibrations can be reduced, and also damage to joint portions of the semiconductor device can be prevented.

A notch 4a is formed in a distal end of each of blades of the impeller 4, and because of the provision of the notches 4a, the impeller 4, larger in diameter than the opening 16a, can be mounted on the heatsink apparatus even if the cover 16 is provided. Besides, the amount of the gas, drawn by the fan 2, can be increased, so that the cooling performance can be enhanced.

In the embodiment shown in FIGS. 1 to 3, the motor portion 3 is mounted directly on the base plate 1, and with such construction the thin-type heatsink apparatus can be provided. However, although not shown in the drawings, the motor portion 3 can be mounted on the cover 16 so as to provide a fan of the suspended type. With such construction, thermal damage to the bearing of the motor portion 3 can be reduced although the thickness of the heatsink apparatus is somewhat increased, and therefore the lifetime of the motor portion 3 can be increased. When the suspended-type fan is used, it is naturally not necessary to provide the projected portion 1e.

Next, the pillar-like members 5 to 9 will be described.

Usually, each of the pillar-like members 5 to 9 has a circular cross-section or a polygonal cross-section. When the pillar-like members 5 to 9 have a circular cross-section, the plate-like members 10 to 14 can be easily fitted on the pillar-like members 5 to 9, and besides a stream of gas, produced by the rotation of the fan 2, can flow smoothly. When the pillar-like members 5 to 9 have a polygonal cross-section, the positioning of the plate-like members 10 to 14 at the time of mounting them can be effected easily, and therefore the productivity is enhanced.

Preferably, the pillar-like members 5 to 9 are made of a material having a thermal conductivity coefficient of not less than 90 W/(m·K) [more preferably, not less than 100 W/(m·K)] at 100° C. More specifically, the pillar-like members can be made of one material selected from the group (hereinafter referred to as "material group") consisting of zinc, aluminum, brass, gold, silver, tungsten, copper, beryllium, magnesium and molybdenum, or an alloy of at least two materials selected from the material group, or an alloy of at least one material, selected from the material group, and at least one material other than the material group. In this embodiment, in view of the workability and the cost, the pillar-like members 5 to 9 are made of aluminum alone, or an alloy of aluminum and at least one material selected from the material group, or an alloy of aluminium and at least one material selected from the materials other than the material group. In another preferred example, the pillar-like members 5 to 9 are made of copper alone, or an alloy of copper and at least one material selected from the material group, or an alloy of copper and at least one material selected from the materials other than the material group.

Opposite end portions of each of the pillar-like members 5 to 9 are narrowed (or reduced in diameter) in a stepped manner, so that the narrow end portions can be easily press-fitted or caulked. Therefore, through holes of a stepped shape are formed through the base plate 1, and a plurality of holes (through which the narrow end portions of the pillar-like members 5 to 9 are passed, respectively, and then these end portions are pressed, or caulked or spread by hammering) are formed through the cover 16. Preferably, the other portion of each pillar-like member 5 to 9 than its opposite end portions is thick so that heat can be efficiently transferred to the plate-like members 10 to 14. In this embodiment, although the opposite end portions of the pillar-like members 5 to 9 are narrowed in a stepped manner, the opposite end portions may be tapering or may be gradually narrowed in a manner of stair. When the pillar-like members are fixedly secured to the base plate 1 and the cover 16 by other means (e.g. adhesive bonding) than pressing and press-fitting, the opposite end portions of a stepped shape need not be provided.

In this embodiment, the five pillar-like members are provided. When the gas is blown out in one direction as shown in FIGS. 1 to 3, it is preferable to provide 2 to 8 pillar-like members in view of the heat transfer performance and the flow resistance.

In the illustrated embodiment, the pillar-like members 5 to 9 have the same shape and size. However, in view of the heat transfer effect (or performance) and the mechanical strength, the pillar-like members 5 to 9 may be different in size and shape, depending on the portion or location at which each pillar-like member is provided, although this somewhat adversely affects the productivity. By doing so, the heat transfer effect and the mechanical strength can be enhanced.

The base plate 1 and the pillar-like members 5 to 9 may be made of the materials different from each other, with a view to facilitating manufacture of the base plate 1 and reducing cost. However, when the base plate 1 and the pillar-like members 5 to 9 are made of the same material, it is possible to prevent disengagement or disassembling of the pillar-like members from the base plate 1 due to difference in thermal expansion coefficient.

Next, the plate-like members 10 to 14 will be described.

In the heatsink apparatus of the type in which the gas is blown out in one direction as shown in FIGS. 1 to 3, the plate-like members 10 to 14 comprise thin plates (or sheets) of an L-shape, respectively. These plate-like members 10 to 14 have substantially the same shape, and each of these plate-like members 10 to 14 has through holes through which the pillar-like members 5 to 9 are passed, respectively. The plate-like members 10 to 14 can have a J-shape, a U-shape or an I-shape, or can have an opening or hole, formed through a central portion thereof, such that the plate-like members 10 to 14 surround the fan 2.

Preferably, the plate-like members 10 to 14 are made of a material having a thermal conductivity coefficient of not less than 90 W/(m·K) [more preferably, not less than 100 W/(m·K)] at 100° C. More specifically, the plate-like members can be made of one material selected from the group (hereinafter referred to as"material group") consisting of zinc, aluminum, brass, gold, silver, tungsten, copper, beryllium, magnesium and molybdenum, or an alloy of at least two materials selected from the material group, or an alloy of at least one material, selected from the material group, and at least one material other than the material group. In this embodiment, in view of the workability and the cost, the plate-like members 10 to 14 are made of aluminum alone, or an alloy of aluminum and at least one material selected from the material group, or an alloy of aluminium and at least one material selected from the materials other than the material group. In another preferred example, the plate-like members 10 to 14 are made of copper alone, or an alloy of copper and at least one material selected from the material group, or an alloy of copper and at least one material selected from the materials other than the material group.

The plate-like members 10 to 14 are fixedly mounted on the pillar-like members 5 to 9 formed upright on the base plate 1 by press-fitting or adhesive bonding. In this condition, the plate-like members 10 and 14 must be held and spaced a predetermined distance from one another. In one method of easily holding these plate-like members at the predetermined intervals, separate spacers (not shown) and the plate-like members are alternately stacked together, so that the spacer is interposed between any two adjacent plate-like members. In another method, a tubular projected portion (flange) is formed integrally on a peripheral edge portion of a pillar-like member insertion hole in each plate-like member. When such plate-like members 10 to 14 are stacked together, the projected portions serve as spacers, respectively, so that the plate-like members are held at the predetermined intervals.

In this embodiment, the number of the plate-like members 10 to 14 is five. When 2 to 7 plate-like members are stacked together, heat can be efficiently transferred to the plate-like members, and the heat-radiating ability of the plate-like members is enhanced, and besides the flow resistance is reduced, so that the radiation of heat can be efficiently effected.

Preferably, the thickness and the number of the plate-like members are so determined that the space or interval between any two adjacent plate-like members is 0.5 to 10 times larger than the thickness of the plate-like member.

Preferably, the radiating portion 15, comprising the stacked plate-like members 10 to 15, is disposed near the gas discharge port 18. With such disposition, heat can be efficiently radiated from the plate-like members 10 to 14 since an amount of gas flow is large in the vicinity of the gas discharge port 18.

In this embodiment, the five plate-like members 10 to 14 have a uniform thickness. However, the plate-like member or members can be increased in thickness near a central portion of the radiating portion 15 while reducing thickness of the plate-like members at the opposite end portions of the radiating portion. With such structure, heat is efficiently transferred from the pillar-like members 5 to 9 to the thickened plate-like member(s) located near the central portion of the radiating portion 15, and the heat is efficiently radiated from the plate-like members at a central portion of the gas discharge port 18 at which the flow velocity is high. In contrast, the plate-like member(s) can be reduced in thickness near the central portion of the radiating portion 15 while increasing thickness of the plate-like members at the opposite end portions of the radiating portion. In this case, the opposite end portions of the radiating portion 15 are increased in mechanical strength, and therefore warp or bending, developing in the plate-like members when these members are stacked together, may be suppressed.

In this embodiment, the distance or spacing between any two adjacent ones of the plate-like members 10 to 14 is uniform over the entire area of the radiating portion 15, this distance can be made larger in the vicinity of the central portion of the radiating portion 15 than at the opposite end portions thereof. With such construction, the flow resistance can be reduced in the vicinity of the central portion of the radiating portion 15 at which the amount of flow of the gas is large, and the heat-radiating effect can be enhanced. In contrast, the distance between any two adjacent ones of the plate-like members 10 to 14 can be made smaller at the central portion of the radiating portion 15 than at the opposite end portions thereof. With such construction, the velocity of flow of the gas, discharged from the gas discharge port 18, can be made uniform.

In this embodiment, although the thickness of each of the plate-like members 10 to 14 is uniform over the entire area thereof, it may be partially varied. For example, that portion of each plate-like member, located adjacent to the gas discharge port 18, may be made larger in thickness than that portion of the plate-like member located adjacent to the side wall 1a (FIG. 1), and by doing so, heat can be effectively transferred to the vicinity of the gas discharge port 18 at which the flow velocity is high, so that the cooling efficiency is enhanced.

In addition to the through holes for respectively passing the pillar-like members 5 to 9 therethrough, a plurality of through holes can be formed through each of the plate-like members 10 to 14, and by doing so, the cooling efficiency can be further enhanced. Stamped-out or cut-and-raised portions can be formed on each of the plate-like members 10 to 14, or the surface of each plate-like member can be roughened, or dimples can be formed in the surface of each plate-like member, and by doing so, the cooling efficiency can be enhanced.

Next, the cover 16 will be described.

The cover 16 is fixedly secured to the pillar-like members 5 to 9 by pressing or caulking (or spreading the ends of these pillar-like members by hammering). The cover 16 can be fixedly secured to only the pillar-like members 5 to 9. Alternatively, it can be fixedly secured to both of the pillar-like members 5 to 9 and the side walls 1a, 1b and 1c by an adhesive or other means. Further, the cover 16 can be fixedly secured to only the side walls by an adhesive or other means.

Although the cover 16 can be suitably made of a resin or metal, it is preferred that the cover 16 be made of a thermally-conductive material, such as metal, in order to enhance the heat-radiating effect. That is, it may be so constructed that the heat is transferred not only to the side walls 1a, 1b and 1c but also to the cover 16 of metal and the heat is radiated from the cover 16.

As described previously, the cover 16 covers at least the radiating portion 15, so that the cover 16 protects the radiating portion 15 and prevents the plate-like members 10 to 14 from deformation.

In this embodiment, by providing the cover 16, the opening 16a for introducing the gas is formed, and besides the gas discharge port 18 is formed between the cover 16 and the base plate 1, and therefore the flow of the gas is controlled, and the radiation of heat is effectively carried out. However, it is possible to eliminate the cover 16, depending on an environment in which the heatsink apparatus is used.

Next, the lead wires 17 and the connector 19 will be described.

Although not shown in the drawings, the lead wires 17 are connected to the motor portion 3 so as to supply an electric power to at least the motor portion 3. A detector for detecting the speed of rotation of the motor portion 3 can be provided, in which case the lead wires 17 may include a signal wire for sending the detection signal. In order to provide a thin design, the lead wires 17 may be in the form of thin wiring such as a flexible printed circuit board, and in this case there is no need to provide the connector 19.

In the heatsink apparatus having the above-described construction, heat received by the base plate 1 is efficiently transferred to the pillar-like members 5 to 9. The heat is then is transferred from the pillar-like members 5 to 9 to the plate-like members 10 to 14, and then the heat is absorbed from the plate-like members 10 to 14 by the stream of the gas produced by the fan 2. Therefore, the heatsink apparatus, though compact in size, achieves the enhanced cooling efficiency.

Second Embodiment

Figure 5:
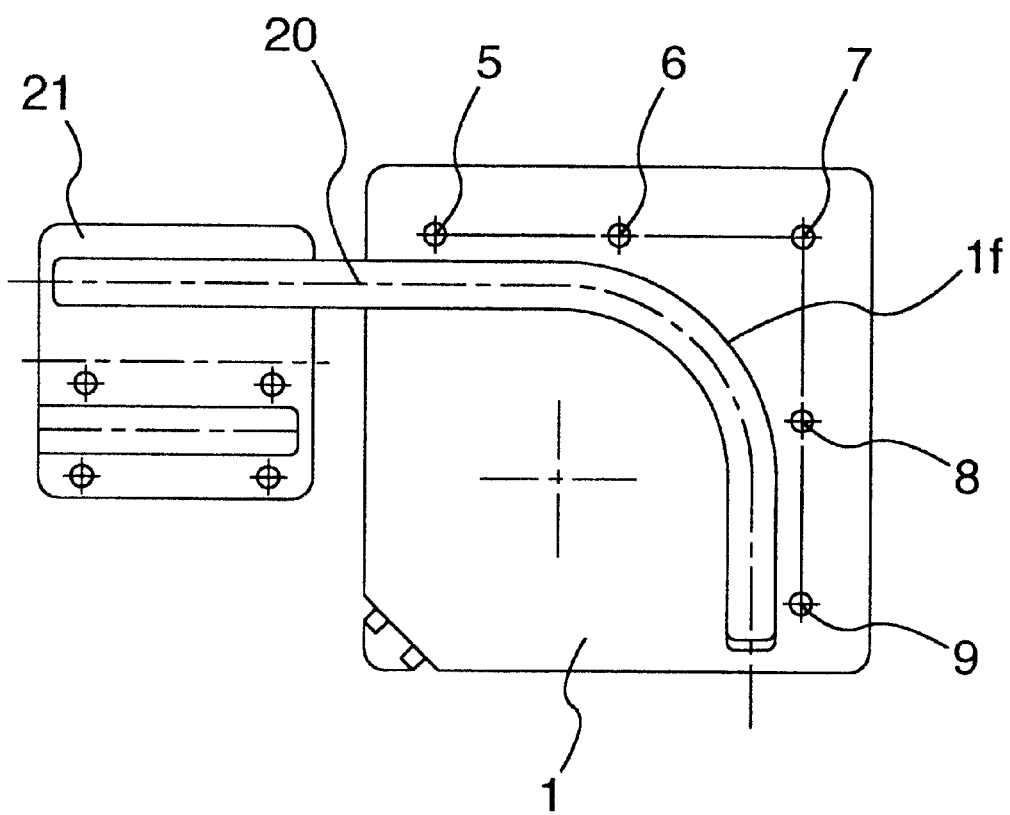
FIG. 5 is a view showing a reverse side of a second embodiment of a heatsink apparatus according to the invention.
Figure 6:
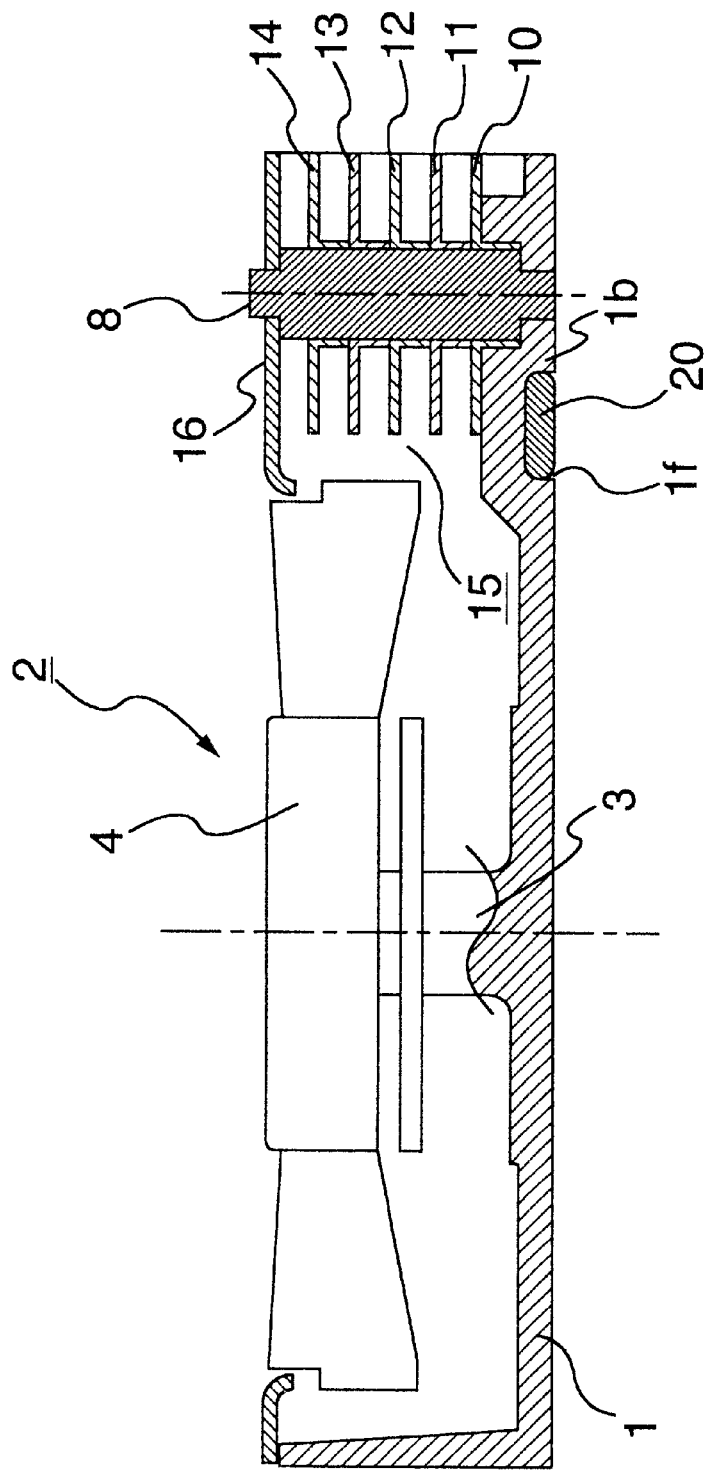
FIG. 6 is a cross-sectional view of the heatsink apparatus of FIG. 5.

FIGS. 5 and 6 show a second embodiment of the invention. FIG. 4 is a view showing a reverse side of a heatsink apparatus of the second embodiment, and FIG. 5 is a cross-sectional view of the heatsink apparatus of the second embodiment.

This embodiment differs from the previously described first embodiment in that a heat transfer member 20 is added.

This construction is useful particularly when the heatsink apparatus is not mounted directly on a heat-generating body such as a semiconductor device.

The heat transfer member 20 is mounted on a base plate 1, and heat is transferred from the heat-generating body (not shown), connected to the heat transfer member 20, to the base plate 1 via the heat transfer member 20, so that the heat can be radiated.

A bar-like member or a sheet-like member, made of materials having a good thermal conductivity, is used as the heat transfer member 20, and examples thereof include a heat pipe, a metal bar, a metal sheet, a carbon bar, a carbon sheet, a graphite bar and a graphite sheet.

Preferably, the heat transfer member 20 is provided to extend along the radiating portion 15 comprising the plate-like members 10 to 14 as shown in FIG. 5. More preferably, the heat transfer member 20 is mounted on the base plate 1 to be opposed to the radiating portion 15.

Most preferably, the heat transfer member 20 is arranged in the vicinity of the pillar-like members 5 to 9 (within a radius of 10 mm (preferably not more than 7 mm) from the axis of each pillar-like member). With such construction, heat, transferred through the heat transfer member 20, is positively transferred to the pillar-like members 5 to 9, and in turn is effectively transferred to the plate-like members 10 to 14. In FIG. 5, the pillar-like member 7 is not disposed near the heat transfer member 20, but when at least a half of the pillar-like members are disposed near the heat transfer member 20, the cooling efficiency can be positively enhanced.

Particularly when a bar-like member, such as a heat pipe, is used as the heat transfer member 20, a recess 1*f* is formed in the reverse surface of the base plate 1, and the heat transfer member 20 is embedded or received in this recess if, as shown in FIG. 6. with such construction, no step is formed on the reverse surface of the base plate 1, and the mounting of the heatsink apparatus is easy. And besides, the area of contact between the heat transfer member 20 and the base plate 1 increases, and therefore heat can be efficiently transferred from the heat transfer member 20 to the base plate 1 and the pillar-like members 5 to 9.

When a sheet-like member is used as the heat transfer member 20, it is not particularly necessary to provide the recess 1*f*. However, if any problem is invited by a step formed on the reverse surface of the base plate 1, the recess If may be provided. When a sheet-like member is used as the heat transfer member, the heat transfer member 20 can be easily arranged beneath not less than a half of the pillar-like members 5 to 9, and in some cases the heat transfer member 20 can be arranged in contact with not less than a half of the pillar-like members 5 to 9, so that the heat-radiating effect can be further enhanced.

Figure 7:
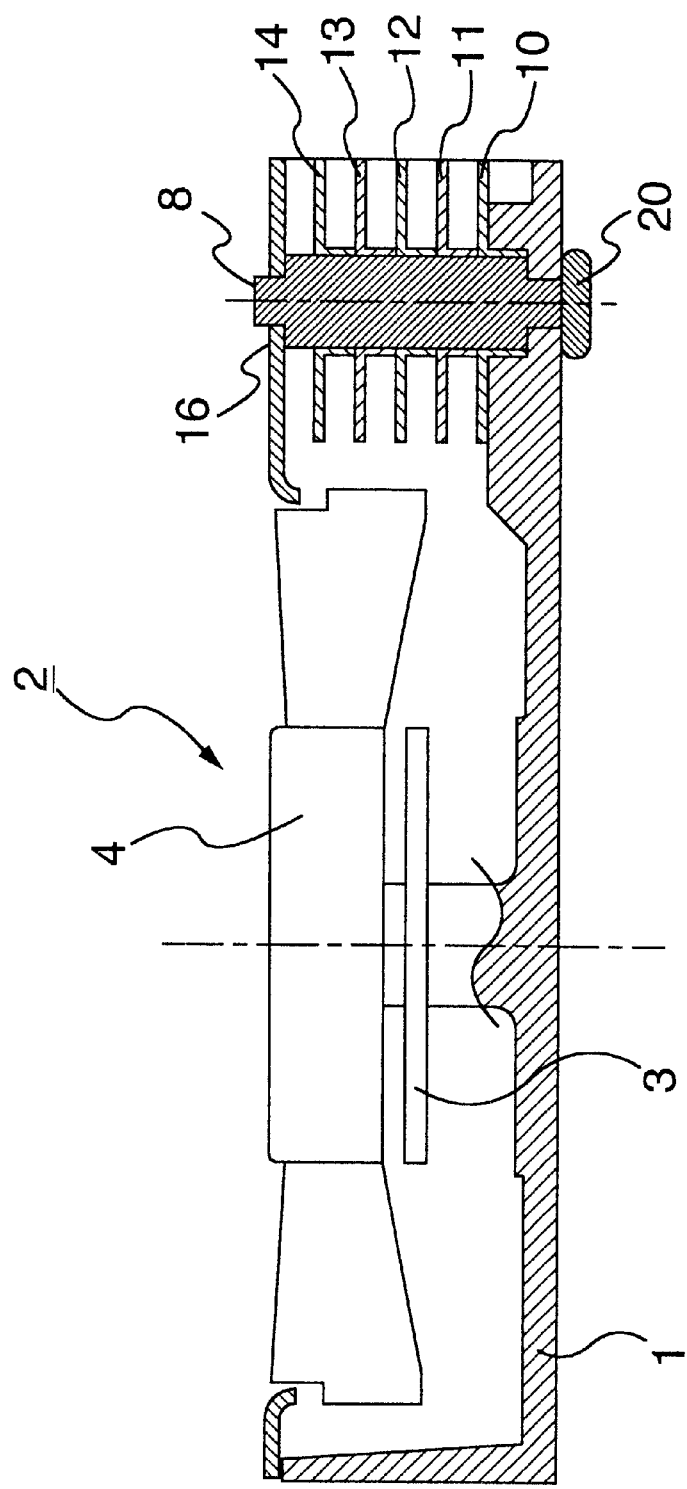
FIG. 7 is a cross-sectional view similar to FIG. 6, showing a modification of the second embodiment.
Figure 8:
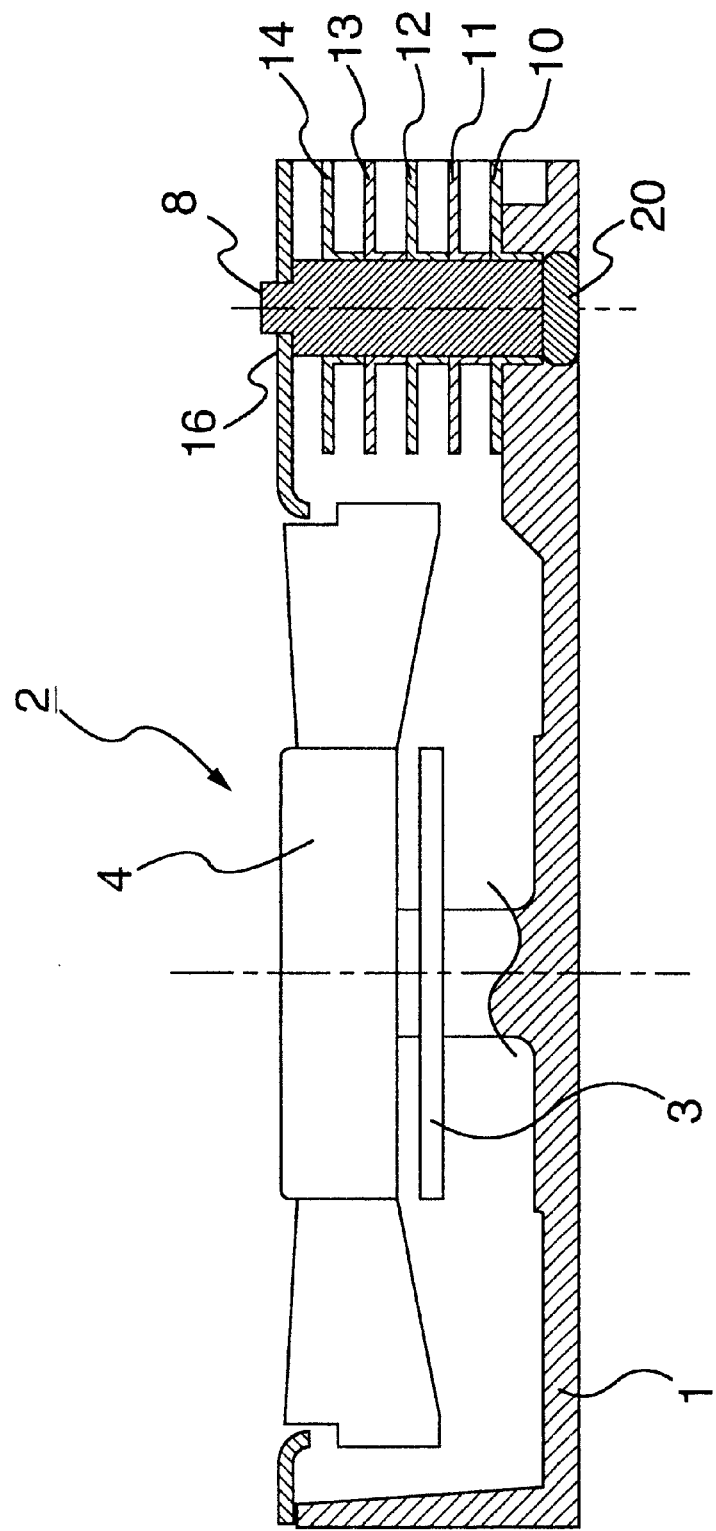
FIG. 8 is a cross-sectional view similar to FIG. 6, showing another modification of the second embodiment.

In a modified heatsink apparatus of the invention shown in FIG. 7, a step is formed on the reverse surface of the base plate 1. In this case, the heat transfer member 20 is arranged beneath or in direct contact with not less than a half of the pillar-like members 5 to 9, and by doing so, the heat-radiating effect can be enhanced. If any difficulty is encountered as a result of formation of a step on the reverse surface of the base plate 1 as in FIG. 7, a recess is preferably formed in the reverse surface of the base plate 1, and is arranged beneath not less than a half of pillar-like members 5 to 9, as shown in FIG. 8. This construction is preferred particularly when the pillar-like members 5 to 9 are formed integrally with the base plate 1.

As shown in FIG. 5, there may be used an arrangement in which the heat-generating body is not mounted directly on the heat transfer member 20, but a heat-receiving member (heat-conducting member) 21 is mounted on the heat transfer member 20, and the heat-receiving member 21 is joined to the heat-generating member. Preferably, the heat-receiving member 21 is in the form of a plate-like member having a square shape similar to an outer shape of a semiconductor device. Preferably, in order that any step will not be formed on the heat-receiving member 21, a recess is formed in the heat-receiving member 21, and the heat transfer member 20 is embedded in this recess. When the heat-receiving member 21 is thus provided, it efficiently absorbs heat, emitted from the heat-generating body such as a semiconductor device, and transfers this heat to the heat transfer member 20, and therefore the cooling efficiency can be enhanced. Further, another heat transfer member, such as a heat pipe, can be connected to the heat-receiving member 21, in which case this heat transfer member is connected directly to the heat-generating body. Another heat-receiving member can be connected to the heat-generating body.

There can be provided a construction in which the first heat-receiving member 21 is connected to the base plate 1 via the first heat transfer member 20, and further a second heat transfer member is connected to the first heat-receiving member, and a second heat-receiving member is mounted on the second heat transfer member, and two heat-generating bodies, such as semi-conductor devices, are connected to the first and second heat-receiving members, respectively, so that the plurality of heat-generating bodies can be cooled.

Figure 9:
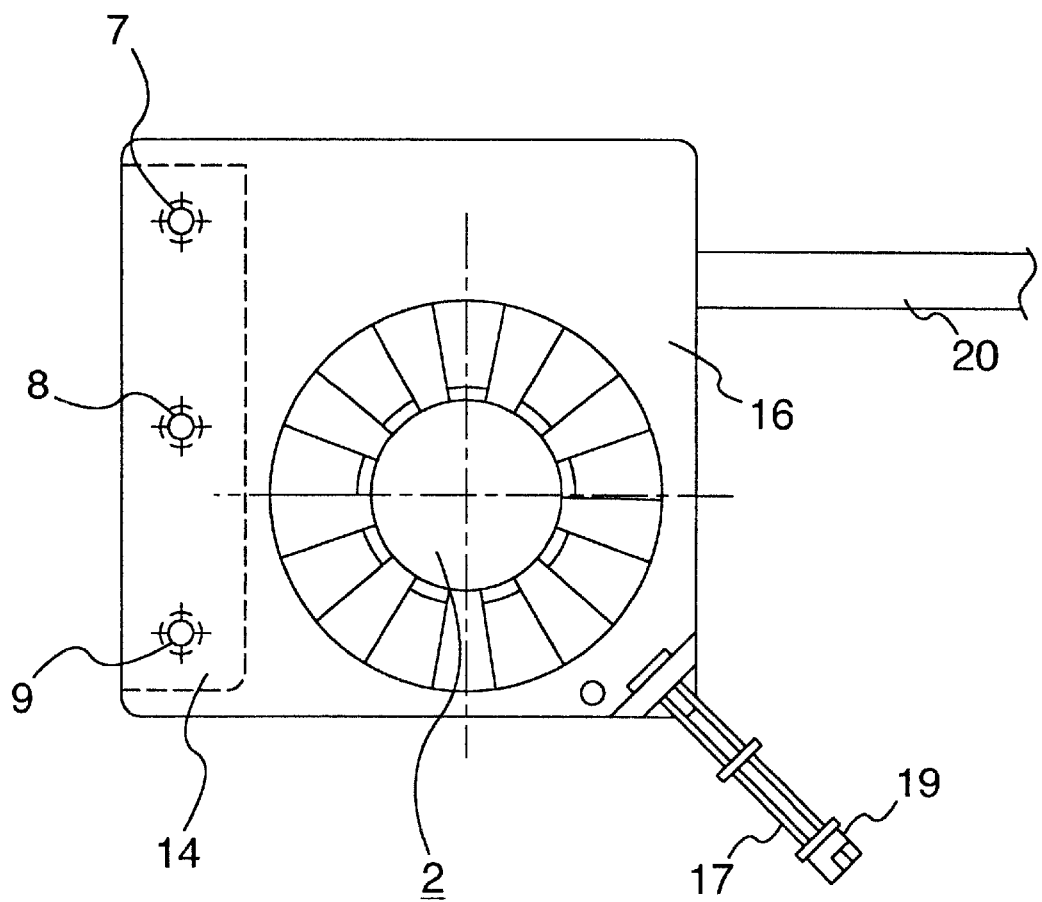
FIG. 9 is a plan view showing a further modification of a heatsink apparatus according to the second embodiment.

FIG. 9 is a plan view of a further modification of the second embodiment in which plate-like members 10 to 14 have an I-shape, and the plate-like members and pillar-like members are provided only at a region opposed to or adjacent to a gas discharge port 18. In this case, a heat transfer member 20 is provided at least in opposed relation to the plate-like members 10 to 14.

Figure 10:
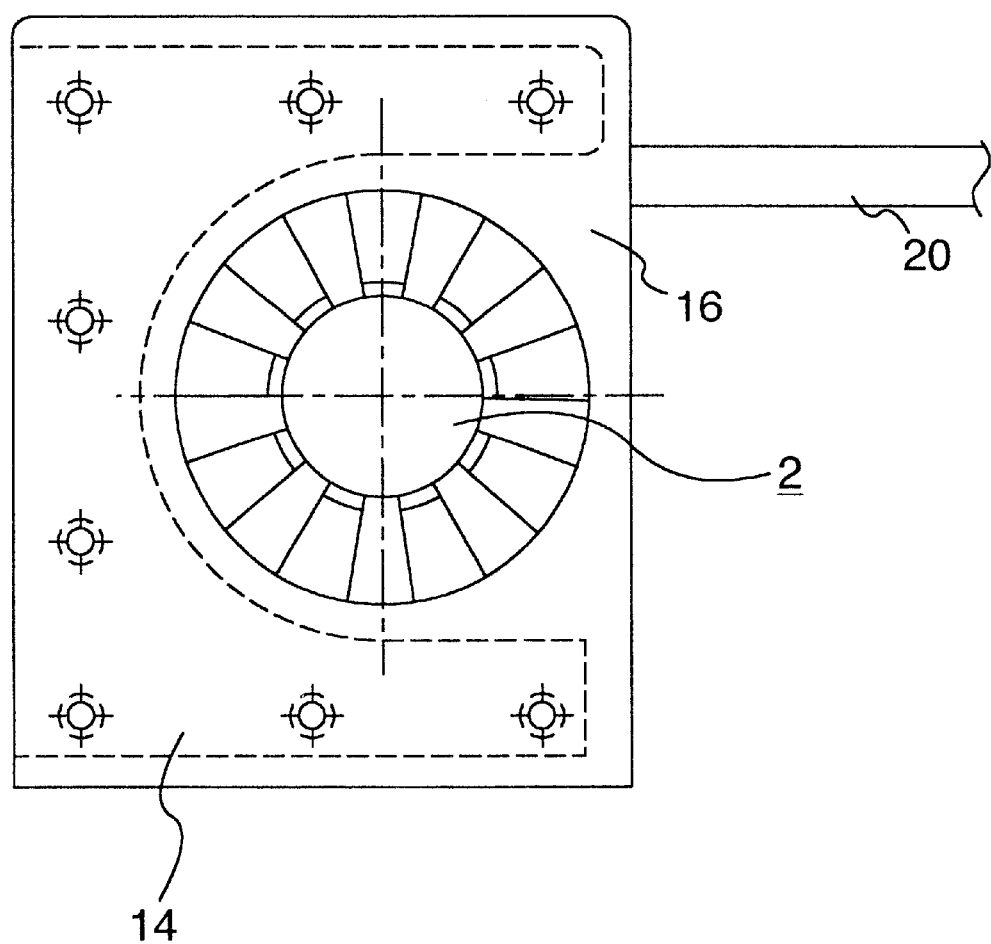
FIG. 10 is a plan view similar to FIG. 9, showing a still further modification of the second embodiment.

FIG. 10 is a plan view of a further modification of the second embodiment, in which plate-like members 10 to 14 have a U-shape. This construction can be used in the type of heatsink apparatus in which gas is blown out of the apparatus in one direction or in two directions.

Figure 11:
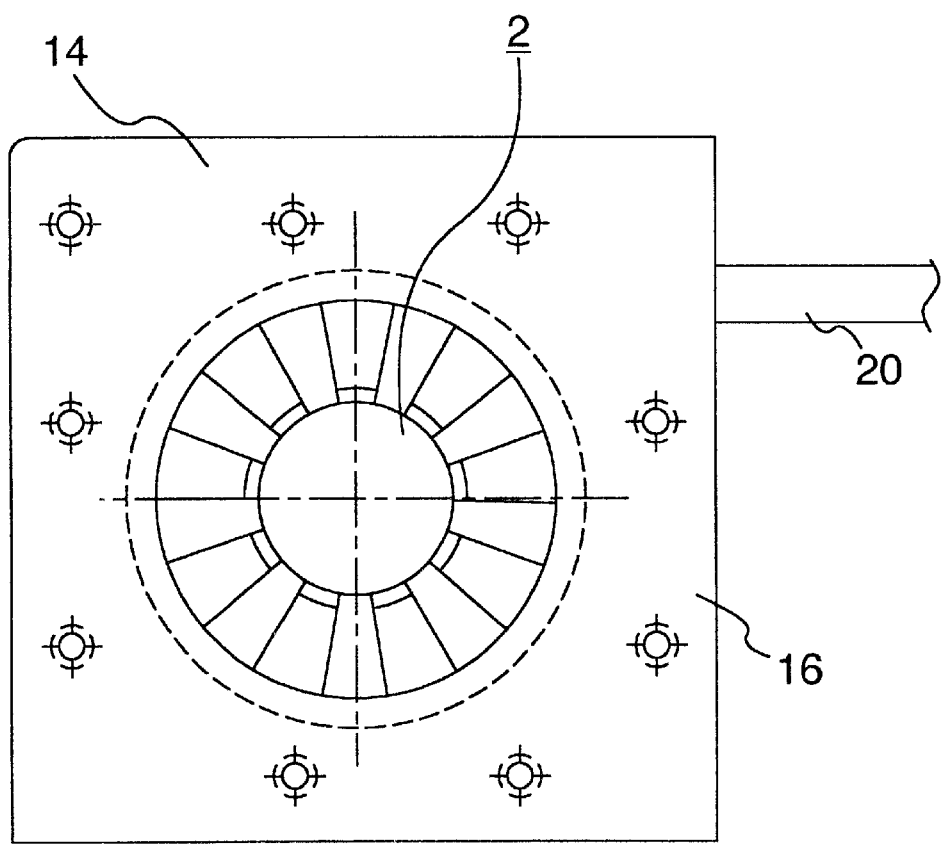
FIG. 11 is a plan view similar to FIG. 9, showing a further modification of the second embodiment.

FIG. 11 is a plan view of a further modification of the second embodiment, in which each of plate-like members 10 to 14 has a central opening (or hole), and the plate-like members 10 to 14 surround a fan 2.

Figure 12:
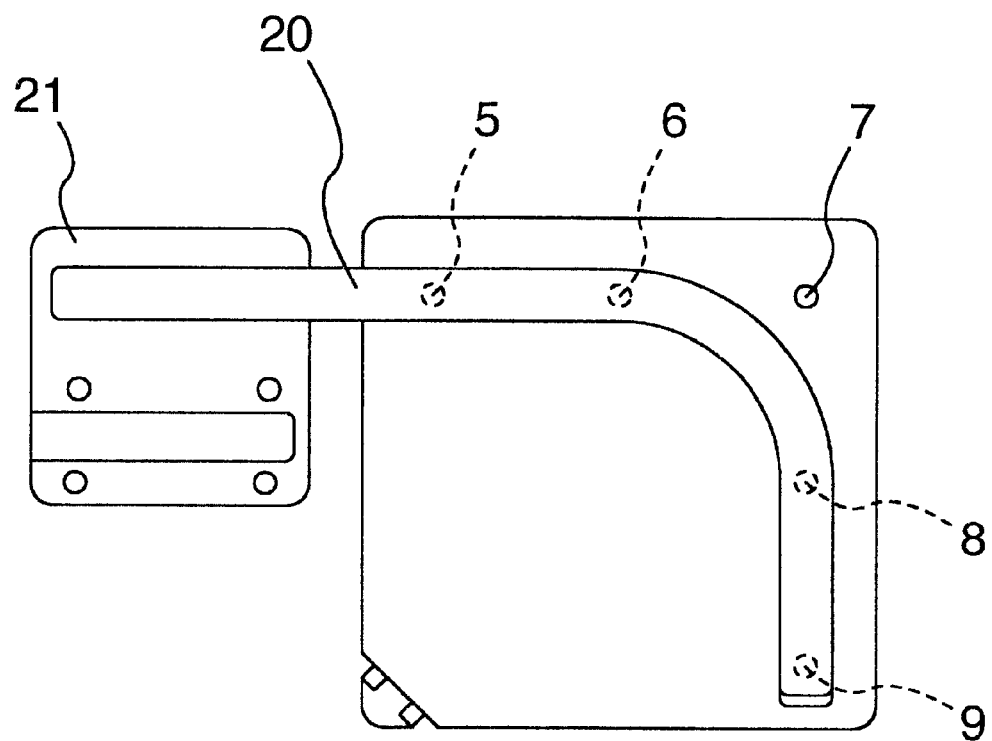
FIG. 12 is a view similar to FIG. 5, showing a further modification of the second embodiment.
Figure 14A:
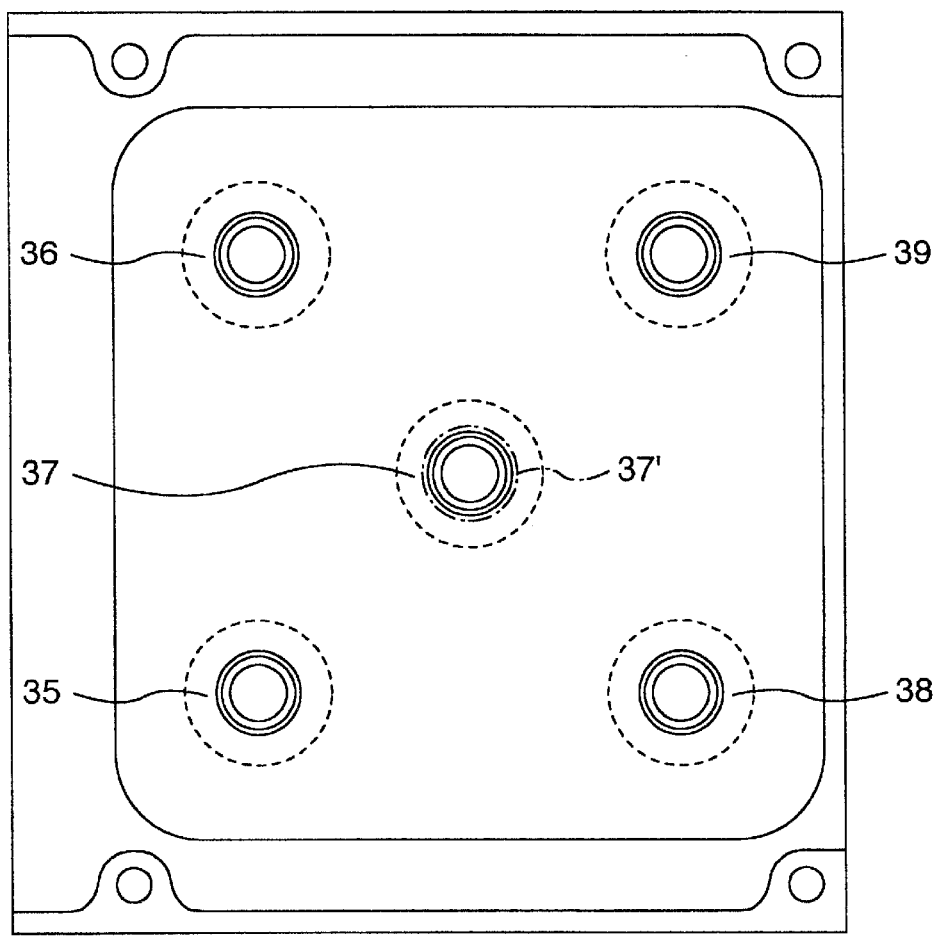
FIG. 14A is a plan view showing in an enlarged scale a heat-radiating portion of the heatsink apparatus shown in FIG. 13A.
Figure 14B:
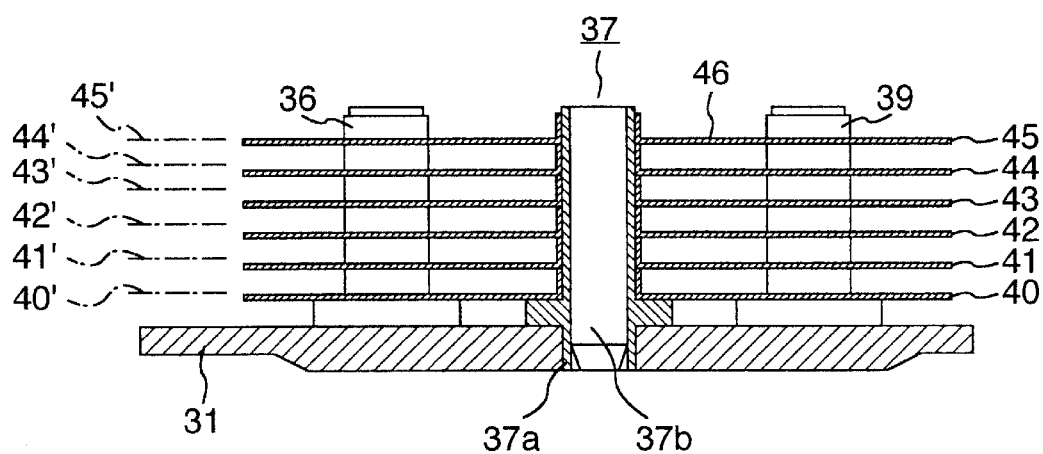
FIG. 14B is a cross-sectional view similar to FIG. 13C, showing the heat radiating portion in an enlarged scale.

FIG. 12 is a view similar to FIG. 5, showing a still further modification of the second embodiment. With the structure of FIG. 12, a heat transfer member 20 is mounted on a side of the base plate 1 opposite to a side thereof from which the pillar-like members 5 to 9 extend. The heat transfer member 20 is mounted on the base plate 1 in a relation opposed to some of the pillar-like members (i.e., the pillar-like members 5, 6, 8 and 9) not opposed to the other of the pillar-like members (i.e., the pillar-like member 7).

Third Embodiment

FIGS. 13A to 13C show a heatsink apparatus according to a third embodiment of the invention.

In this third embodiment, a heat-generating body 30 is mounted on a base plate 31. A part of the base plate 31 on which the heat-generating body 30 is mounted has a larger thickness than the other part of the base plate 31, with a view to improving heat transfer efficiency. A fan 32 is mounted on the base plate 31. Generally, the fan 32 comprises drive means such as a motor, and an impeller 34 driven by the drive means. In this third embodiment, the fan 32 comprises a motor portion 33, including coils and magnets (not shown), and an impeller 34 mounted on the motor portion 33. Pillar-like members 35 to 39 are mounted perpendicularly on the base plate 31, and plate-like (or sheet-like) members 40 to 45 are mounted on the pillar-like members 35 to 39 by press-fitting, welding or the like. The plate-like members 40 to 45, mounted on the pillar-like members 35 to 39, are spaced a predetermined distance from one another. The plate-like members 40 to 45 form a heat-radiating portion 46. The fan 32 and the plate-like members 40 to 45 are arranged on the base plate 31 in a side-by side relationship with each other. Such arrangement contributes to reducing thickness of the heatsink apparatus.

A cover 47 is mounted directly or indirectly on the base plate 31 and covers the radiating portion 46, and an opening 47a is formed in that portion of the cover 47 facing the fan 32.

Lead wires 48 supply an electric power for at least rotating the fan 32, and a connector (not shown) is secured to the lead wires 48.

The base plate 31 has side walls 31a, 31b and 31c formed integrally at three side edge portions thereof, respectively. The cover 47 is held against edges of the side walls 31a, 31b and 31c. An opening is formed at that side of the base plate 31 (having no side wall) opposite to the side wall 1b, and this opening serves as a gas discharge port 49. In accordance with rotation of the fan 32, a gas flows into the heatsink apparatus in a vertical direction A, and then the gas absorbs heat from the plate-like members 40 to 45 when it passes these plate-like members 40 to 45, and the thus heated gas is discharged from the heatsink apparatus through the gas discharge port 49 in a direction B.

In the heatsink apparatus of such construction, the main surfaces of the plate-like members 40 to 45 of the radiating portion 46 face the base plate 31 (preferably in parallel relation thereto). Thus, heat can be efficiently transmitted from the plate-like members 40 and 45 to a stream of gas produced by the fan 32, and therefore a heat-radiating effect can be enhanced though the heatsink apparatus is compact in size. Further, the part of the base plate 31 on which the heat-generating body 30 is mounted has a larger thickness than the other part of the base plate 31, the pillar-like members 35 to 39 are disposed on a back side of the base plate 31 opposite to the side thereof on which the heat-generating body 30 is mounted, and the plate-like members 40 to 45 are mounted on the pillar-like members 35 to 39. Thus, heat may be efficiently transferred from the heat-generating body 30 to the plate-like members 40 to 45 and hence heat-radiating effect can be further improved.

Various portions of the heatsink apparatus of the above construction will be described in detail hereunder.

The cover 47, the lead wires 48 and the connector (not shown) are substantially similar to those of the first embodiment, so that the description thereon is eliminated.

In the illustrated embodiment, the part of the base plate 31 on which the heat-generating body 30 is mounted has a larger thickness than the other part of the base plate 31. However, in the case where heat transfer efficiency is sufficient, the thickness of the part of the base plate 31 on which the heat-generating body 30 is mounted may be identical with the other part of the base plate 31. The other structure or feature of the base plate 31 is substantially identical with the base plate of the previously described first embodiment, so that the detailed description thereon is eliminated.

Next, the pillar-like members 35 to 39 will be described with reference to FIGS. 13A to 13C, and FIGS. 14A and 14B which show a main portion of a heat-radiating portion 46 of the heatsink apparatus.

Usually, each of the pillar-like members 35 to 39 has a circular cross-section. When the pillar-like members 35 to 39 have a circular cross-section, the plate-like members 40 to 45 can be easily fitted on the pillar-like members 35 to 39, and besides a stream of gas, produced by the rotation of the fan 2, can flow smoothly. However, the cross-sectional shape of the pillar-like members 35 to 39 is not limited to the circular shape, and for example the pillar-like members 35 to 39 may have a polygonal cross-section.

Since the pillar-like members 35 to 39 are substantially identical with each other, only the pillar-like member 37 will be described hereunder. The pillar-like member 37 is of double-layered structure having a tubular member 37a and a core body or a filling member 37b inserted thereinto. The tubular member 37a has one end portion formed with a flange portion, and the core body 37b has one end portion tapered in such a manner as to gradually reduce its diameter toward its one distal end. The tubular member 37a is mounted on the base plate 31 with the flange portion engaged with a part of the base plate 31 surrounding a hole formed through the base plate 31. Then, the plate-like members 40 to 45 are mounted or fitted on the tubular member 37a. Thereafter, the core body 37b is press-fitted into the tubular member 37a from the side of the core body 37b having the tapered end portion.

The flange portion of the tubular member 37a facilitates positioning of the tubular member 37a when the tubular member 37a is mounted on the base plate 31. Further, the flange portion contributes to making heat to be smoothly transferred from the base plate 31 to the pillar-like member 37.

The pillar-like members 35 to 39 may be made of a material having a thermal conductivity coefficient of not less than 90 W/(m·K) [more preferably, not less than 100 W/(m·K)] at 100° C. More specifically, the pillar-like members can be made of one material selected from the group (hereinafter referred to as "material group") consisting of zinc, aluminum, brass, gold, silver, tungsten, copper, beryllium, magnesium and molybdenum, or an alloy of at least two materials selected from the material group, or an alloy of at least one material, selected from the material group, and at least one material other than the material group. In this embodiment, in view of the workability, the tubular member 37a and the core body 37b are made of copper alone. However, it is possible to make the tubular member 37a and the core body 37b of the materials different from each other. In this embodiment, the tubular member 37a has a thickness of about 0.3t and an outer diameter of 10–12 Φ, and the core body 37b has a diameter of 9.7–11.7 Φ.

In the illustrated embodiment, five pillar-like members are provided. However, it is possible to change the number of the pillar-like members provided. It is preferable that the number of the pillar-like members is one to eight, in view of the heat transfer performance, flow resistance, shape and size of the plate-like members, and productivity.

In the illustrated embodiment, the pillar-like members 35 to 39 have the same shape and size. However, in order to improve heat conductivity and mechanical strength, the pillar-like members 35 to 39 may be different in size and shape, depending on the portion at which each pillar-like member is provided, though such structure may somewhat adversely affect the productivity. Further, it is possible to improve heat conductivity by increasing diameter of the pillar-like member 37 which abuts on a heat-generating point of the heat-generating body 30. The pillar-like member having thus increased diameter is shown by one-dot-chain-line 37' in FIG. 14A.

As described hereinabove, each of the pillar-like members 35 to 39 has a double-layered structure. However, it is possible to use the pillar-like members of multi-layered structure inclusive of double (or two)-layered structure and more than two-layered structure. Further, it is possible to arrange a heat pipe in the pillar-like members, with a view to improving heat conductivity.

Figure 15:
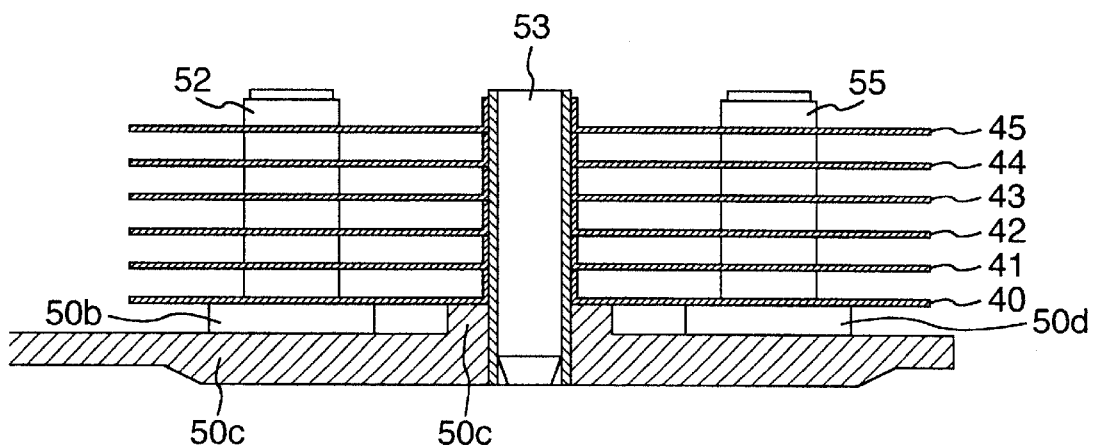
FIGS. 15 to 19 are cross-sectional views similar to FIG. 14B, showing various modifications of the heat-radiating portion of the third embodiment.

FIG. 15 shows a modification of a heat-radiating portion of the third embodiment. In this modification, the pillar-like members 51 to 55 (the pillar-like members 51 and 54 being not illustrated) do not have a flange portion, and instead the base plate 50 has projected portions 50a~50e (projected portions 50a and 50e being not illustrated) around the holes formed through the base plate 50. With such structure, heat may be directly transferred from the base plate 50 to the plate-like member 40 and hence heat transfer efficiency is improved.

Next, the plate-like members 40 to 45 will be described.

As shown in FIGS. 13A to 13C, and FIGS. 14A and 14B, each of the plate-like members 40 to 45 is formed of a rectangular thin plates (or sheets). These plate-like members 40 to 45 have substantially the same shape, and each of these plate-like members 40 to 45 has through holes into which the pillar-like members 35 to 39 are inserted or fitted.

Preferably, the plate-like members 40 to 45 are made of a material having a thermal conductivity coefficient of not less than 90 W/(m·K) [more preferably, not less than 100 W/(m·K)] at 100° C. More specifically, the plate-like members can be made of one material selected from the group (hereinafter referred to as "material group") consisting of zinc, aluminum, brass, gold, silver, tungsten, copper, beryllium, magnesium and molybdenum, or an alloy of at least two materials selected from the material group, or an alloy of at least one material, selected from the material group, and at least one material other than the material group. In this embodiment, in view of the workability and the cost, the plate-like members 40 to 45 are made of copper alone, or an alloy of copper and at least one material selected from the material group, or an alloy of copper and at least one material selected from the materials other than the material group.

The plate-like members 40 to 45 are fixedly mounted on the pillar-like members 35 to 39 formed upright on the base plate 31 by press-fitting. The plate-like members 40 to 45 must be held with a predetermined distance spaced from one another. In one method of easily holding these plate-like members at the predetermined intervals, each plate-like member is provided, around a pillar-like member insertion hole formed through each plate-like member, with a projection integrally with the plate-like member. The projections of the plate-like members, thus provided, serve as spacers when the plate-like members are stacked together, so that they may be held with a predetermined distance spaced apart from each other.

In this embodiment, each of the plate-like members 40 to 45 has a uniform thickness over the entire area thereof. However, the plate-like members 40 to 45 can be increased in thickness at a central portion of the heat-radiating portion 46 while reducing thickness at the end portions of the plate-like members. In this case, heat is efficiently transferred from the pillar-like member 37 to the thickened central portions of the plate-like members, and the heat is efficiently radiated from these plate-like members at the central portions. Further, the plate-like members 40 to 45 can be increased in thickness at the portions adjacent to the pillar-like members 35 to 39. In such case, heat may be efficiently transferred from the pillar-like members 35 to 39 to the plate-like members 40 to 45 and effectively radiated at the plate-like members.

In this embodiment, the distance or spacing between any two adjacent ones of the plate-like members 40 to 45 is uniform over the entire area of the radiating portion 46. However, the distance between the plate-like members 40 and 41 located near the heat-generating body 30 may be made larger than the distance between the plate-like members 44 and 45 located remote from the heat-generating body 30. with such construction, the flow resistance may be reduced and hence the flow rate is increased in the vicinity of the heat-generating body 30, with the resultant enhancement of the heat-radiating effect. For example, the plate-like members may be arranged as shown by one-dot-chain-lines 40' to 45' in FIG. 14B. In this arrangement, a space between the base plate 30 and the adjacent plate-like member 40', a space between the plate-like members 40' and 41', a space between the plate-like members 41' and 42', and a space between the plate-like members 42' and 43' are made larger than a space between the plate-like members 43' and 44' and a space between the plate-like members 44' and 45'. In this manner, among a space between the base plate and one of the plate-like members adjacent to the base plate and a space between any one of two adjacent plate-like members, at least one of the spaces may be made larger than the other space(s).

In this embodiment, although the thickness of each of the plate-like members 40 to 45 is uniform over the entire area thereof, it may be partially varied. For example, that portion of the plate-like members 40 and 41, disposed adjacent to the heat-generating body 30, may be made larger in thickness than that portion of the plate-like members 45 and 46 disposed remote from the heat-generating body 30. With such construction, heat conductivity efficiency can be enhanced, heat can be smoothly dissipated and heat-radiating efficiency can be improved.

Figure 16:
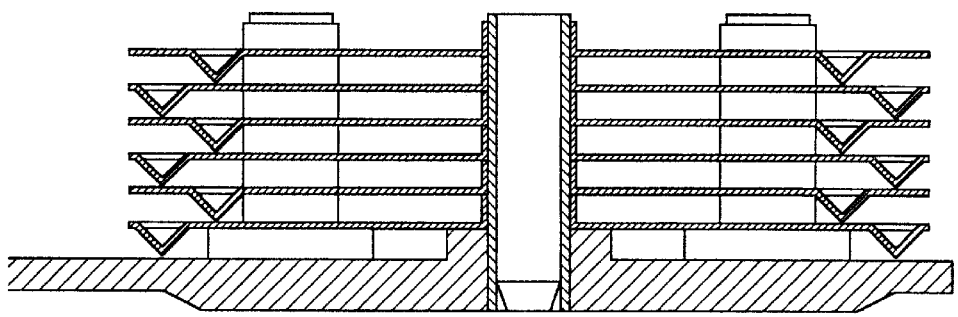
Figure 17:
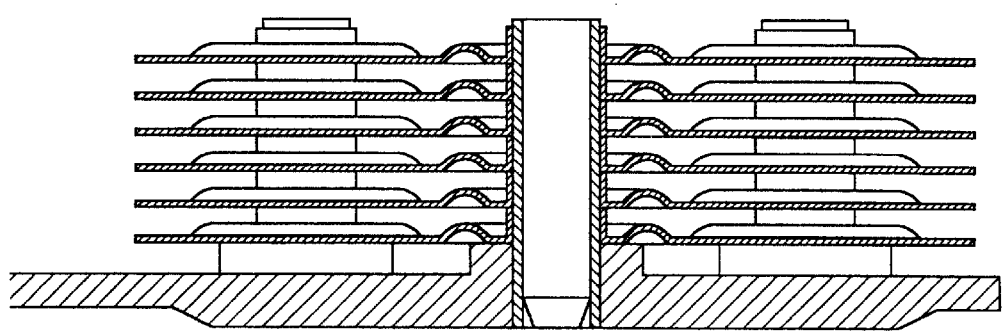
Figure 18:
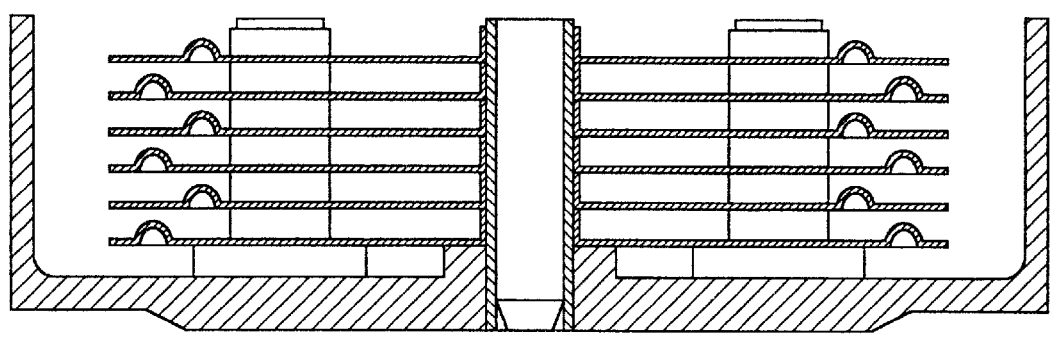

FIGS. 16, 17 and 18 show further modifications of heat-radiating portions of the heatsink apparatus according to the third embodiment. As shown in these Figures, the plate-like members 40 to 45 may be formed with projections, corrugations, pleats, grooves, recesses, cut-and-raised portions or the like of various shapes. With such construction, the space or interval among the plate-like members may be reliably retained. Further, the distortion or warp of the plate-like members may be absorbed when the pillar-like members are press-fitted into the plate-like members.

In addition to the through holes for respectively inserting the pillar-like members 35 to 39 thereinto, a plurality of through holes can be formed through each of the plate-like members 40 to 45. Further, cut (or stamped)-and-raised portions can be formed on each of the plate-like members 40 to 45, or the surface of each plate-like member can be roughened. With such construction, turbulent flow may be produced and the surface area may be increased and hence the heat-radiating efficiency can be enhanced.

Figure 19:
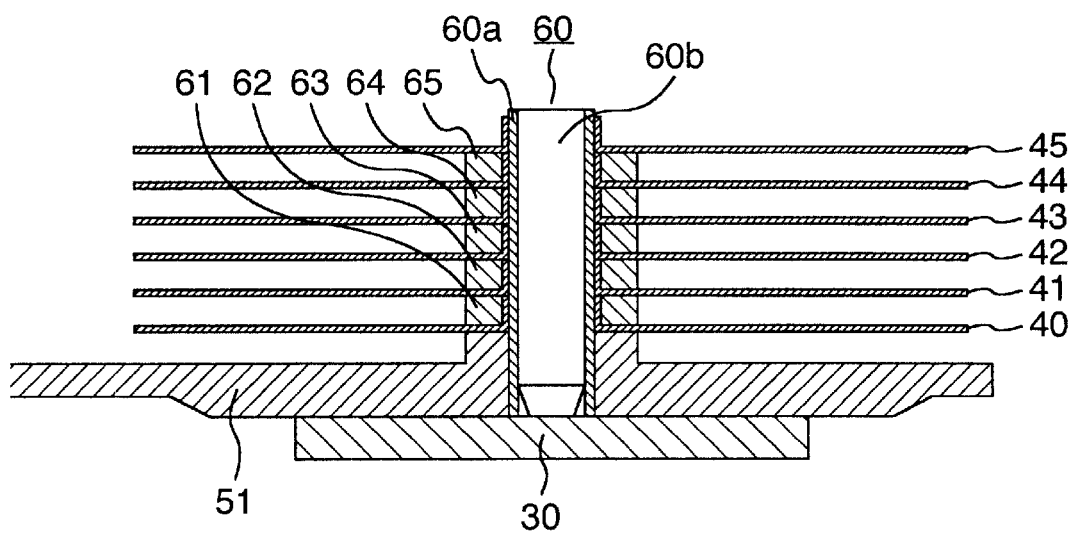

FIG. 19 shows further modification of the heat-radiating portion of the third embodiment. In this modification, only one pillar-like member 60 is provided, unlike the previously described third embodiment in which five pillar-like members are provided.

With the structure of FIG. 19, the plate-like members 40 to 45 are held in position with spacers 61 to 65 interposed thereamong. A tubular member 60a is inserted into a through hole formed in the base plate 51 and the plate-like members 40 to 45 and the spacers 61 to 65 are alternately inserted or fitted on the tubular member 60a. Then a core body 60b is press-fitted into the tubular member 60a, and the plate-like members 40 to 45 and the spacers 61 to 65 are soldered together. That is, the plate-like members 40 to 45 and the spacers 61 to 65 coated with cream solder are assembled together and then heat is applied to the assembly to effect soldering. It is of course possible to use adhesives of good thermal conductivity instead of solder. The above-described construction brings about the meritorious effects similar to the case where the diameter of the pillar-like member is increased. That is, it brings about good heat conductivity, smooth heat dissipation and improved heat radiating effects.

Preferably, the spacers 61 to 65 may be made of a material having a thermal conductivity coefficient of not less than 90 W/(m·K) [more preferably, not less than 100 W/(m·K)] at 100° C. More specifically, the spacers can be made of one material selected from the group (hereinafter referred to as "material group") consisting of zinc, aluminum, brass, gold, silver, tungsten, copper, beryllium, magnesium and molybdenum, or an alloy of at least two materials selected from the material group, or an alloy of at least one material, selected from the material group, and at least one material other than the material group. In this embodiment, in view of the workability and the cost, the spacers are made of copper alone, or an alloy of copper and at least one material selected from the material group, or an alloy of copper and at least one material other than the material group.

In this embodiment, the thickness and diameter of each of the spacers 61 to 65 are uniform over the entire area thereof. However, the thickness of the spacers 61 to 65 may be varied depending on the spaces or distances among the plate-like members 40 to 45. Further, the diameter of the spacers 61 and 62 located near the heat-generating body 30 may be made larger than the diameter of the spacers 64 and 65 located remote from the heat-generating body 30. In other words, the diameter of the spacers may be gradually increased as the location of the spacers approaches the heat generating body 30. With such construction, the optimized flow rate may be produced, and the meritorious effects similar to the case where the pillar-like member 60 has the shape suitable for the heat conductivity characteristic.

Figure 20A:
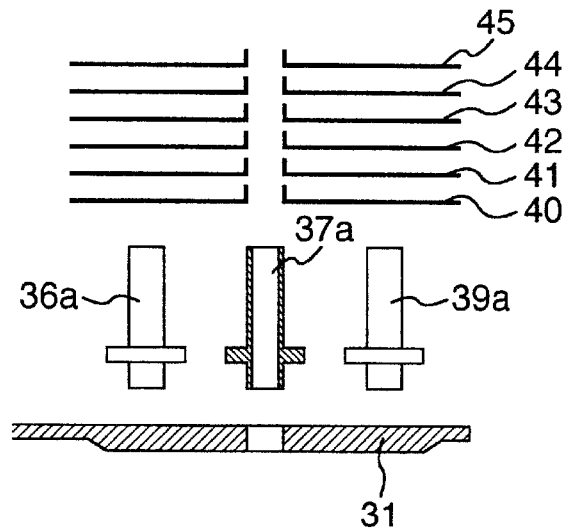
FIGS. 20A to 20D are cross-sectional views showing the process of assembling the heat-radiating portion of the third embodiment.
Figure 20B:
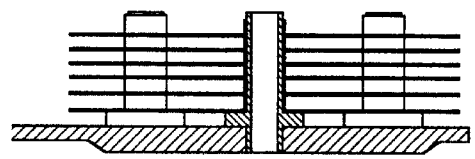
Figure 20C:
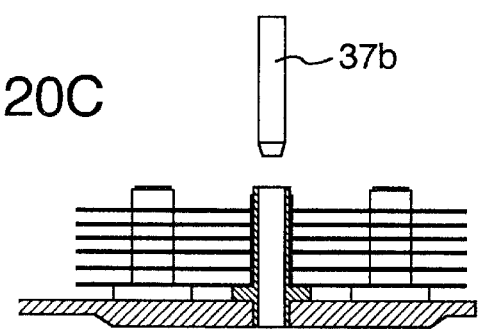
Figure 20D:
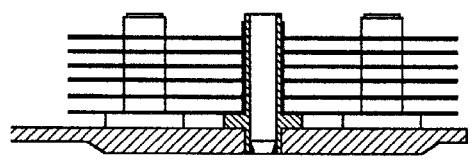

FIGS. 20A to 20D show an example of assembling the heat-radiating portion. As shown in FIGS. 20A and 20B, the five tubular members (only three tubular members 36a, 37a and 39a being illustrated) are inserted into the through holes formed in the base plate 31. In this example, an outer diameter of the tubular members is 0~0.1 mm smaller than a diameter of the through holes formed in the base plate. Then, the plate-like members 40 to 45 are stacked together with the through holes of the plate-like members 40 to 45 fitted onto the tubular members. In this example, a diameter of the through holes of the plate-like members 40~45 is 0~0.1 mm larger than an outer diameter of the tubular members. Next, as shown in FIGS. 20C and 20D, the core bodies (only one core body 37b being illustrated) are press-fitted into the tubular members. Namely, one 37b of the core bodies is first fitted into the tubular member 37a located at a central position, and then the other core bodies are successively fitted into the tubular members located outside the tubular member 37a. In this example, an outer diameter of the core members is 0.1~0.4 mm larger than an inner diameter of the tubular members. The through holes of the base plate 31, the tubular members and the core members are press-fitted together, and similarly the plate-like members, the tubular members and the core members are press-fitted together.

As will be apparent from the foregoing description, a heatsink apparatus according to the invention comprises a base plate, a heat radiating portion including plate-like members having main surfaces facing or directed to the base plate, and blowing means mounted on the base plate. With such structure, heat can be transferred from the base plate to the plate-like members and it is possible to enhance cooling efficiency with a compact construction.

What is claimed is:

1. A heatsink apparatus comprising a base plate, a heat radiating portion, and blowing means mounted on said base plate, said heat radiating portion including plate-like members having main surfaces facing said base plate, wherein:

said radiating portion surrounds said blowing means except a part of said blowing means, and each of said plate-like members has substantially a U-shape.

2. The heatsink apparatus according to claim 1 wherein said plate-like members are stacked together with a predetermined space defined therebetween.

3. The heatsink apparatus according to claim 1 further comprising pillar-like members extending substantially perpendicularly from said base plate, said plate-like members being mounted on said pillar-like members.

4. The heatsink apparatus according to claim 1 further comprising pillar-like members extending substantially perpendicularly from said base plate, said plate-like members being mounted on said pillar-like members, wherein said pillar-like members are formed integrally with said base plate.

5. The heatsink apparatus according to claim 1 further comprising pillar-like members extending substantially perpendicularly from said base plate, said plate-like members being mounted on said pillar-like members, wherein said pillar-like members are formed separately from said base plate and are mounted thereon.

6. A heatsink apparatus comprising a base plate, a heat radiating portion, and blowing means mounted on said base plate, said heat radiating portion including plate-like members having main surfaces facing said base plate, wherein:

said radiating portion surrounds said blowing means except a part of said blowing means, and each of said plate-like members has substantially an L-shape.

7. The heatsink apparatus according to claim 6 wherein said plate-like members are stacked together with a predetermined space defined therebetween.

8. The heatsink apparatus according to claim 6 further comprising pillar-like members extending substantially perpendicularly from said base plate, said plate-like members being mounted on said pillar-like members.

9. The heatsink apparatus according to claim 6 further comprising pillar-like members extending substantially perpendicularly from said base plate, said plate-like members being mounted on said pillar-like members, wherein said pillar-like members are formed integrally with said base plate.

10. The heatsink apparatus according to claim 6 further comprising pillar-like members extending substantially perpendicularly from said base plate, said plate-like members being mounted on said pillar-like members, wherein said pillar-like members are formed separately from said base plate and are mounted thereon.

11. A heatsink apparatus comprising a base plate; a heat radiating portion, blowing means mounted on said base plate said heat radiating portion including plate-like members having main surfaces facing said base plate; pillar-like members extending substantially perpendicularly from said base plate, said plate-like members being mounted on said pillar-like members; and a heat transfer member that is mounted on a side of said base plate opposite to a side thereof from which said pillar-like members extend, said heat transfer member being mounted thereon in an opposed relation to said pillar-like members.

12. The heatsink apparatus according to claim 11 wherein said pillar-like members are formed integrally with said base plate.

13. The heatsink apparatus according to claim 11 wherein said pillar-like members are formed separately from said base plate and are mounted thereon.

14. A heatsink apparatus comprising a base plate; a heat radiating portion; blowing means mounted on said base plate, said heat radiating portion including plate-like members having main surfaces facing said base plate; pillar-like members extending substantially perpendicularly from said base plate, said plate-like members being mounted on said pillar-like members; and a heat transfer member that is mounted on a side of said base plate opposite to a side thereof from which said pillar-like members extend, said heat transfer member being mounted thereon in a relation not opposed to said pillar-like members.

15. The heatsink apparatus according to claim 14 wherein said pillar-like members are formed integrally with said base plate.

16. The heatsink apparatus according to claim 14 wherein said pillar-like members are formed separately from said base plate and are mounted thereon.

17. A heatsink apparatus comprising a base plate; a heat radiating portion; blowing means mounted on said base plate, said heat radiating portion including plate-like members having main surfaces facing said base plate; pillar-like members extending substantially perpendicularly from said base plate, said plate-like members being mounted on said pillar-like members; and a heat transfer member that is mounted on a side of said base plate opposite to a side thereof from which said pillar-like members extend, said heat transfer member being mounted thereon in a relation opposed to some of said pillar-like members and not opposed to the other of said pillar-like members.

18. The heatsink apparatus according to claim 17 wherein said pillar-like members are formed integrally with said base plate.

19. The heatsink apparatus according to claim 17 wherein said pillar-like members are formed separately from said base plate and are mounted thereon.

20. A heatsink apparatus comprising a base plate; a heat radiating portion; blowing means mounted on said base plate, said heat radiating portion including plate-like members having main surfaces facing said base plate; and a plurality of pillar-like members extending substantially perpendicularly from said base plate, said pillar-like members including at least one pillar-like member having a diameter larger than a diameter of another of said pillar-like members.

21. A heatsink apparatus comprising a base plate, at least one pillar-like member extending substantially perpendicularly from said base plate, a plurality of plate-like members mounted on said pillar-like member, and blowing means mounted on said base plate, said plate-like members being stacked together with a predetermined space defined therebetween and having main surfaces facing said base plate, wherein among a space between said base plate and one of the plate-like members adjacent to said base plate and a space between any one of two adjacent plate-like members, at least one of said spaces is larger than at least one of the other spaces.

* * * * *